United States Patent
Ganusov et al.

(10) Patent No.: US 9,118,310 B1
(45) Date of Patent: Aug. 25, 2015

(54) PROGRAMMABLE DELAY CIRCUIT BLOCK

(71) Applicant: Xilinx, Inc., San Jose, CA (US)

(72) Inventors: Ilya K. Ganusov, San Jose, CA (US);
Benjamin S. Devlin, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/482,832

(22) Filed: Sep. 10, 2014

(51) Int. Cl.
*H03K 19/177* (2006.01)
*H03K 5/14* (2014.01)
*H03K 5/135* (2006.01)
*H03K 19/173* (2006.01)

(52) U.S. Cl.
CPC .............. *H03K 5/14* (2013.01); *H03K 5/135* (2013.01); *H03K 19/1737* (2013.01); *H03K 19/17748* (2013.01)

(58) Field of Classification Search
CPC .......................... H03K 5/133; H03K 19/17774
USPC ................................. 326/38–41, 93
See application file for complete search history.

(56) References Cited

U.S. PATENT DOCUMENTS

| | | | | |
|---|---|---|---|---|
| 5,923,197 | A | * | 7/1999 | Arkin ............................ 327/262 |
| 6,043,677 | A | * | 3/2000 | Albu et al. ...................... 326/39 |
| 2003/0222693 | A1 | * | 12/2003 | Cohen et al. ................... 327/277 |

OTHER PUBLICATIONS

Specification and drawings for U.S. Appl. No. 14/056,154, filed Oct. 17, 2013, Ganusov et al.

* cited by examiner

*Primary Examiner* — Don Le
(74) *Attorney, Agent, or Firm* — Kevin T. Cuenot

(57) ABSTRACT

A programmable delay circuit block includes an input stage having a cascade input and a clock input, wherein the input stage passes a signal received at the cascade input or a signal received at the clock input. The programmable delay circuit block further may include a delay block configured to generate a delayed signal by applying a selected amount of delay to the signal passed from the input stage and a pulse generator configured to generate a pulse signal having a pulse width that depends upon the amount of delay. The programmable delay circuit block also includes an output stage having a cascade output and a clock output. The output stage is configured to pass an inverted version of the pulse signal or the delayed signal from the cascade output and pass the signal received at the clock input, the inverted version of the pulse signal, or the delayed signal from the clock output.

20 Claims, 6 Drawing Sheets

200

| Number of Programmable Delays | Delay Contributions | Achieved Delay |
|---|---|---|
| 1 | 0 | 0 |
| 1 | 50 | 50 |
| 1 | 100 | 100 |
| 2 | 100+50 | 150 |
| 1 | 200 | 200 |
| 2 | 200+50 | 250 |
| 2 | 100+200 | 300 |
| 3 | 50+100+200 | 350 |
| 1 | 400 | 400 |
| 2 | 50+400 | 450 |
| 2 | 100+400 | 500 |
| 3 | 100+400+50 | 550 |
| 2 | 200+400 | 600 |
| 3 | 50+200+400 | 650 |
| 3 | 100+200+400 | 700 |
| 4 | 50+100+200+400 | 750 |
| 2 | 400+400 | 800 |
| 3 | 50+400+400 | 850 |
| 3 | 100+400+400 | 900 |
| 4 | 50+100+400+400 | 950 |
| 3 | 200+400+400 | 1000 |
| 4 | 50+200+400+400 | 1050 |

FIG. 2

PROGRAMMABLE DELAY CIRCUIT BLOCK

TECHNICAL FIELD

This disclosure relates to integrated circuits (ICs) and, more particularly, to programmable delay circuit blocks for use within an IC.

BACKGROUND

Integrated circuits (ICs) are manufactured using ever smaller feature sizes. One consequence of using smaller feature sizes is that wiring resources take on greater resistance and capacitance. The increased resistance and capacitance produce greater signal delays, which in turn may result in setup and hold timing violations in a circuit. The setup and hold violations prevent correct circuit operation and are often a limiting factor in increasing circuit performance.

The clock architecture of many ICs is relatively inflexible and may be unable to meet the stringent timing requirements of modern circuit designs. In many cases, the available clock architecture does not provide an adequate level of control over the clock signals propagated therein.

SUMMARY

A programmable delay circuit block includes an input stage having a cascade input and a clock input, wherein the input stage passes a signal received at the cascade input or a signal received at the clock input. The programmable delay circuit block further may include a delay block configured to generate a delayed signal by applying a selected amount of delay to the signal passed from the input stage and a pulse generator configured to generate a pulse signal having a pulse width that depends upon the amount of delay. The programmable delay also includes an output stage having a cascade output and a clock output. The output stage is configured to pass the pulse signal or the delayed signal from the cascade output and pass the signal received at the clock input, the pulse signal, or the delayed signal from the clock output.

A clock circuit includes a first programmable delay circuit block having a first cascade input, a first clock input, a first delay line having multiple taps, a first pulse generator, a first cascade output, and a first clock output. The clock circuit further includes a second programmable delay circuit block having a second cascade input, a second clock input, a second delay line having multiple taps, a second pulse generator, a second cascade output, and a second clock output. The first cascade output is coupled to the second cascade input.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 2 is a table illustrating exemplary delays achieved using one or more of the programmable delays described with reference to FIG. 1.

DETAILED DESCRIPTION

Figure 1:
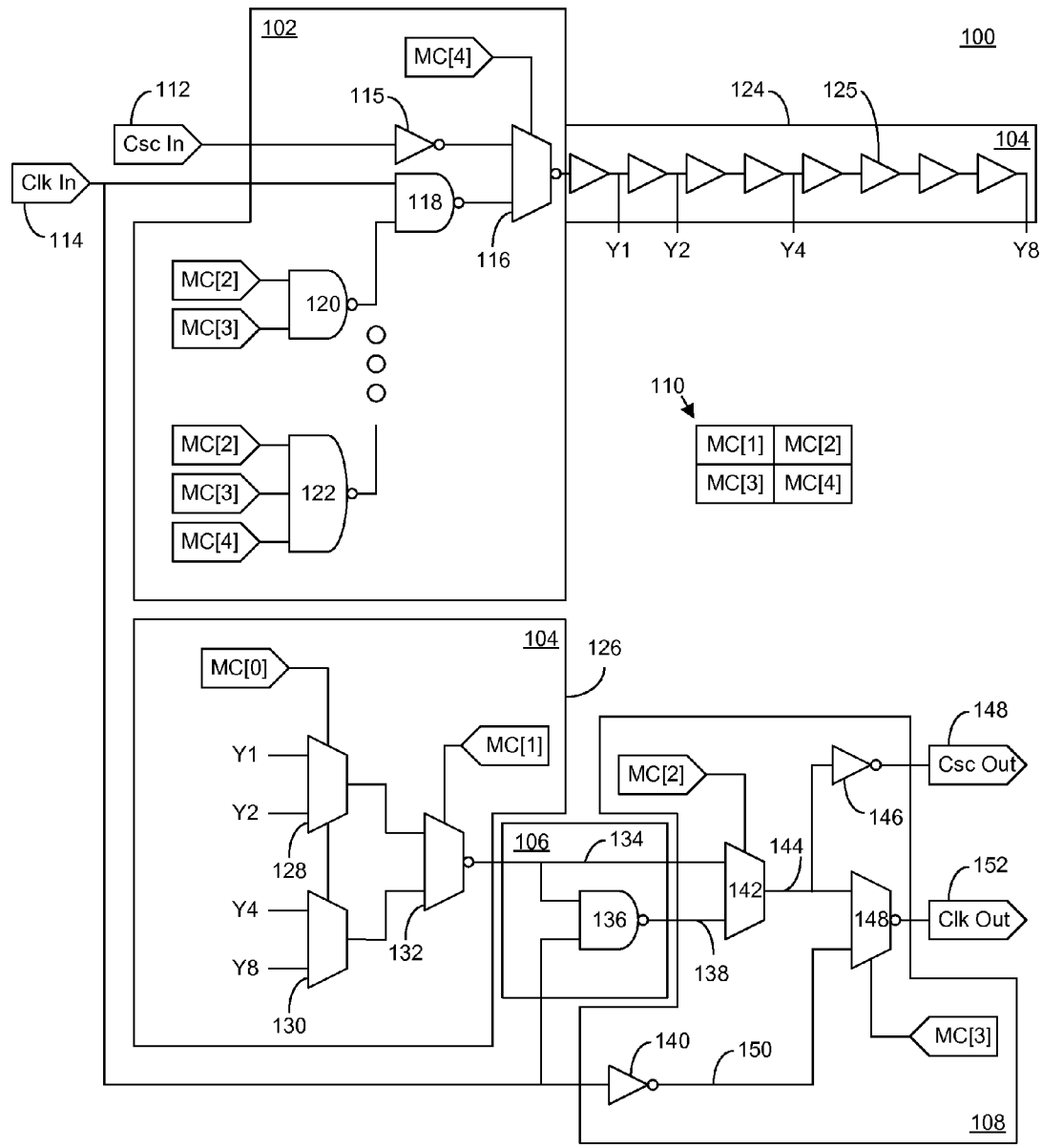
FIG. 1 is a circuit diagram illustrating an exemplary programmable delay circuit block (programmable delay).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to programmable delay circuit blocks for use within an IC. In accordance with the inventive arrangements disclosed herein, a programmable delay circuit block is described that provides increased flexibility and control over clock signals and clock signal generation. In one aspect, skew of a clock signal may be controlled. In another aspect, pulse signals may be generated of having a programmable pulse width.

The programmable delay circuit block includes a cascaded input and a cascaded output thereby allowing multiple programmable delay circuit blocks to be daisy chained serially for increased control over the incremental amount of delay that may be applied to a clock signal as well as the ability to apply more delay to a clock signal than is possible with a single programmable delay circuit block individually. Further details will be described with reference to the figures below.

The inventive arrangements described herein may be implemented as an IC, as circuitry within an IC, as one or more reusable circuit blocks, or the like. In one aspect, the inventive arrangements may be implemented in the form of circuitry within a programmable IC such as a field programmable gate array (FPGA) or other type of IC that includes at least some programmable circuitry. In another aspect, the inventive arrangements may be implemented as a non-transitory computer-readable storage medium storing a digitized description of circuitry that, when utilized by an electronic design automation (EDA) system, may be incorporated into a circuit design and manufactured as part of an IC. Further aspects may be implemented as a method of processing signals performed using one or more programmable delay circuit blocks and/or a method of implementing a clock architecture within an IC.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a circuit diagram illustrating an exemplary programmable delay circuit block (programmable delay) 100. Programmable delay 100 includes an input stage 102, a delay block 104, a pulse generator 106, and an output stage 108. Delay block 104 is formed of a delay line 124 and a delay selector 126. Further, programmable delay 100 includes a plurality of memory cells 110. In one aspect, memory cells 110 are configuration memory cells that are loaded with configuration data. The configuration data may be loaded into an IC that includes one or more of circuit blocks 100 to store either a one value or a zero value in each memory cell 110 thereby configuring programmable delay 100 for operation.

Input stage 102 includes two inputs. The first input is a cascade input 112 illustrated in FIG. 1 as "Csc In". The second input is a clock input 114 illustrated in FIG. 1 as "Clk In." Cascade input 112 is provided to an input of an inverter 115. An output of inverter 115 is provided to a first input of a multiplexer 116. Multiplexer 116 is an inverting multiplexer. Clock input 114 is provided to a first input of a NAND circuit 118. The output of NAND circuit 118 is provided to a second input of multiplexer 116. The value stored in memory cell MC[4] determines whether multiplexer 116 passes the signal received at cascade input 112 or the signal that is output from NAND circuit 118 to delay line 124 of delay block 104. The signal passed by multiplexer 116 is inverted prior to entering delay line 124.

The second input of NAND circuit 118 receives an output from either a NAND circuit 120 or a NAND circuit 122. As pictured, NAND circuit 120 performs a logical NAND operation on the values obtained from memory cells MC[2] and MC[3]. NAND circuit 120 may gate the signal received at clock input 114 or pass the signal received at clock input 114 to multiplexer 116. NAND circuit 122 performs a logical NAND operation on the values stored in memory cells MC[2], MC[3], and MC[4]. NAND circuit 122 may gate the signal received at clock input 114 or pass the signal received at clock input 114 to multiplexer 116

In reference to gating the signal received at clock input 114 using NAND circuit 120, memory cells 110 may be configured so that when MC[2] and MC[3] are set to 1 values, the output from NAND circuit 120 is a logic 0. In the case of gating the signal received at clock input 114 using NAND circuit 122, memory cells 110 may be configured so that when MC[2], MC[3], and MC[4] are set to 1 values, the output from NAND circuit 122 is a logic 0. With a logic 0 provided to the second input of NAND circuit 118, the output of NAND circuit 118 will always be a logic 1 regardless of the value of the signal that is received at clock input 114. Accordingly, clock input 114 is gated. The output of multiplexer 116 will be a logic 0, thereby preventing delay line 124 from toggling to reduce dynamic power when delay line 124 is not needed and/or not used.

NAND circuit 120 and NAND circuit 122 are provided as alternatives. In one aspect, delay line 124 may be gated using the 2-input NAND circuit 120 with NAND circuit 122 being excluded from programmable delay 100. Using NAND circuit 120 and gating delay line 124 gates delay line 124 to ground. The 2-input NAND circuit 120 requires less area than the 3-input NAND circuit 122, but provides fewer configurations of programmable delay 100 as fewer of memory cells 110 are used. For example, the clock architecture illustrated in FIG. 9 herein may not be implemented using NAND circuit 120.

In another aspect, delay line 124 may be gated using the 3-input NAND circuit 122 with NAND circuit 120 being excluded from programmable delay 100. As noted, use of the 3-input NAND circuit 122 requires greater area than using NAND circuit 120, but provides an increased number of configurations of programmable delay 100. For example, using NAND circuit 122, the clock architecture illustrated in FIG. 9 may be implemented.

As noted, delay block 104 includes delay line 124 and delay selector 126. Delay line 124 may be implemented as a multi-tap delay line. Delay line 124 further is binary weighted. In the example of FIG. 1, delay line 124 is formed of buffers 125. The output taps from delay line 124 are labeled Y1, Y2, Y4, and Y8. In one aspect, output tap delay Y1 may apply 50 picoseconds of delay to any signal entering delay line 124. Output tap Y2 may provide 100 picoseconds of delay to any signal entering delay line 124. Output tap Y4 may provide 200 picoseconds of delay to any signal entering delay line 124. Output tap Y8 may provide 400 picoseconds of delay to any signal entering delay line 124. Other delay amounts may be provided. The delay amounts provided herein are exemplary and not intended as limitations.

In one aspect, the inclusion of buffers 125 within delay line 124 allows substitution of the buffer(s) 125 in place of existing buffers in the clock architecture. More particularly, one or more buffers of the clock architecture may be omitted due to the use of buffer(s) 125 within delay line 124, thereby reducing the required area for the clock architecture within the IC.

Delay selector 126 receives each of output taps Y1, Y2, Y4, and Y8. A particular one of output taps Y1, Y2, Y4, or Y8 is selected and passed as signal 134 by loading appropriate values within memory cells 110 and, in particular, memory cells MC[0] and MC[1]. Memory cell MC[0] controls multiplexers 128 and 130. Multiplexer 128 passes either output tap Y1 or Y2 depending upon the value stored in memory cell MC[0]. Multiplexer 130 passes either output tap Y4 or Y8 depending upon the value stored in memory cell MC[0]. Multiplexer 132 passes the selected output tap as signal 134 according to the value stored in memory cell MC[1]. Multiplexer 132 is an inverting multiplexer. Accordingly, signal 134 is an inverted version of the signal passed by multiplexer 132. As defined herein, the term "pass" in reference to a signal, means "output" and/or "generate." For example, an inverting multiplexer passing a signal refers to the inverting multiplexer selecting a signal, inverting the selected signal, and outputting the selected and inverted signal.

Pulse generator 106 includes a NAND circuit 136. As pictured, NAND circuit 136 receives signal 134 from delay selector 126 as a first input. NAND circuit 136 further receives clock input 114 as a second input. NAND circuit 136, by performing a logical NAND operation upon signal 134, i.e., output tap Y1, Y2, Y4, or Y8, and clock input 114, generates a pulse signal 138 having a selected pulse width. The pulse width is programmable and depends upon the particular output tap, i.e., the amount of delay applied to the signal processed through delay line 124, that is selected and passed as signal 134 to pulse generator 106.

In one aspect, the signal received at cascade input 112 may be passed to delay line 124 and on to pulse generator 106 as signal 134. The signal received at cascade input 112 may be a delayed signal from another, prior programmable delay. By further delaying the signal received at cascade input 112 through delay line 124 and passing the further delayed version of that signal from a selected output tap as signal 134 to pulse generator 106, a pulse signal with pulses of larger width than are otherwise attainable may be created. Pulse generator 106 may use the rising edge of the signal processed through delay line 124 as the rising edge of pulse signal 138. Since pulse signal 138 is inverted, pulse signal 138 is inverted back to the correct sense by inverter 146 or by multiplexer 148. As pictured, multiplexer 148 is an inverting multiplexer. For example, NAND circuit 135 uses the rising edge of signal 134 to generate the falling edge of the pulse that is output from multiplexer 148, e.g., after sense correction. By providing pulse signal 138 as an output from programmable delay 100 sense corrected, one or more downstream synchronous circuit elements, e.g., flip-flops, may be selectively converted into latches to allow for time borrowing operations when clocked by sense corrected pulse signal 138. Within this specification, reference to the generated pulse signal as an output from programmable delay 100 means an inverted version of pulse signal 138, i.e., the sense corrected pulse signal output from multiplexer 148.

Output stage 108 provides a variety of different output options. Output stage 108 receives clock input 114 at inverter 140. Output stage 108 receives pulse signal 138 at an input of multiplexer 142. Output stage 108 receives signal 134 from multiplexer 132 at another input of multiplexer 142. Multiplexer 142 passes either pulse signal 138 or signal 134, which is either Y1, Y2, Y4, or Y8, as an output as signal 144. Multiplexer 142 passes pulse signal 138 or signal 134 based upon the value stored in memory cell MC[2].

Signal 144 is provided to both an input of inverter 146 and to a first input of multiplexer 148. An output of inverter 146 provides cascade output 148, which is pictured as "Csc Out." Multiplexer 148 receives signal 150, which is an inverted version of clock signal 114, at a second input. Multiplexer 148 passes either signal 144 or signal 150 and inverts the passed signal as clock output 152 based upon the value stored in memory cell MC[3]. The path for clock signals processed through clock input 114 to inverter 140 and out to multiplexer 148 when not delayed may utilize low-threshold transistor(s) in the path to minimize jitter.

Programmable delay 100 may be used within an IC clock architecture to skew clock signals and/or to generate pulse signals having pulse widths of programmable lengths. When multiple ones of programmable delay 100 are incorporated into an IC clock architecture, a programmable delay that is otherwise unused and neighbors another programmable delay may be cascaded using the cascade inputs and cascade outputs. Multiplexers are used which allow delay line 124 to couple to either clock input 114 or cascade input 112, which may be coupled to a cascade output of another, different programmable delay. Cascaded programmable delays may have a variety of possible connections that facilitate creation of larger delays with finer levels of granularity that are otherwise possible.

Further, because programmable delay 100 processes clock signals for skew adjustment and generates pulse signals, either of which may be further delayed in another programmable delay that is cascaded, phase-shifted clocks and phase-shifted pulse signals may be generated at a leaf of the clock architecture by distributing programmable delays 100 throughout an IC as part of the clock architecture at the leaf nodes without requiring use of extra clock tracks within the IC. Such an arrangement saves power and area for circuitry that utilizes multiple phase-shifted versions of the same clock signal.

FIG. 2 is a table 200 illustrating exemplary delays achieved using one or more of the programmable delays described with reference to FIG. 1. The left column entitled "Number of Programmable Delays" indicates the number of programmable delays that must be used serially, e.g., cascaded or daisy chained, to achieve the total amount of delay in the right column entitled "Achieved Delay." The middle column entitled "Delay Contributions" shows the amount of delay that is contributed by each of the serially connected, individual programmable delays.

Due to the binary weighting in delay line 124, each programmable circuit may contribute as little as 50 picoseconds of delay and a maximum of 400 picoseconds of delay. As illustrated in Table 200, more than 1,050 picoseconds of delay may be achieved by cascading 4 programmable delays together. The amount of delay applied by one or more programmable delays using a cascaded architecture increases in increments of 50 picoseconds, which is the smallest amount of delay that may be applied by a single one of programmable delays 100.

FIGS. 3-9 illustrate exemplary cascaded architectures that may be implemented by storing appropriate values within the memory cells. Within FIGS. 3-9, the active signal paths through the illustrated programmable delays are shown using bold for wires (signals) and terminals. The programmable delays illustrated within FIGS. 3-9 are simplified for ease of illustration. Various circuit elements such as inverters, memory cells, and the like are omitted for clarity.

It should be appreciated that in each of the examples illustrated in FIGS. 3-9, programmable delay A and programmable delay B are independently configurable. Each programmable delay has its own set of memory cells for configuration. Thus, the amount of delay applied by the delay line of programmable delay A may differ from the amount of delay applied by the delay line of programmable delay B. Further, a pulse signal generated by programmable delay A may differ, e.g., have a different pulse width and/or a different delay, than the pulse signal generated by programmable delay B. Further, any signal output from a Clk Out of either one or both of programmable delays A and/or B is available to drive local clock loads for the respective programmable delay.

Figure 3:
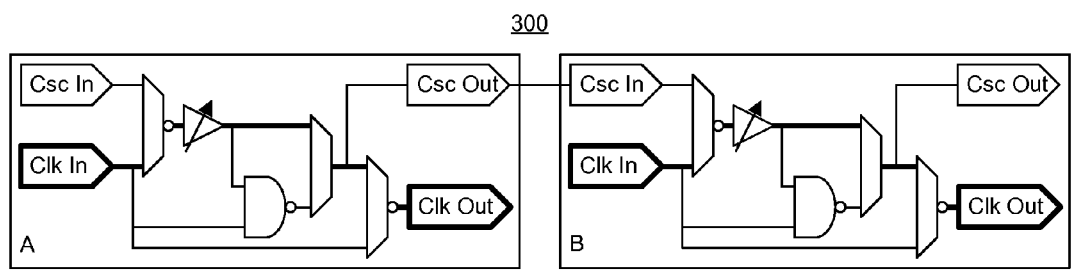
FIG. 3 is a circuit diagram illustrating an exemplary cascaded architecture using programmable delays.

FIG. 3 is a circuit diagram illustrating an exemplary cascaded architecture 300 using programmable delays. FIG. 3 illustrates an example in which programmable delay A processes a first clock signal, while programmable delay B processes a second, independent clock signal. For example, referring to FIG. 3, a clock signal is received at Clk In (clock input 114) of each of programmable delays A and B, is passed through the delay line of each programmable delay, and is then passed to Clk Out (clock output 152) of programmable delays A and B. Though Csc Out (cascaded output 148) and Csc In (cascaded input 112) are coupled together, the cascaded inputs and cascaded outputs are not used in cascaded architecture 300.

Figure 4:
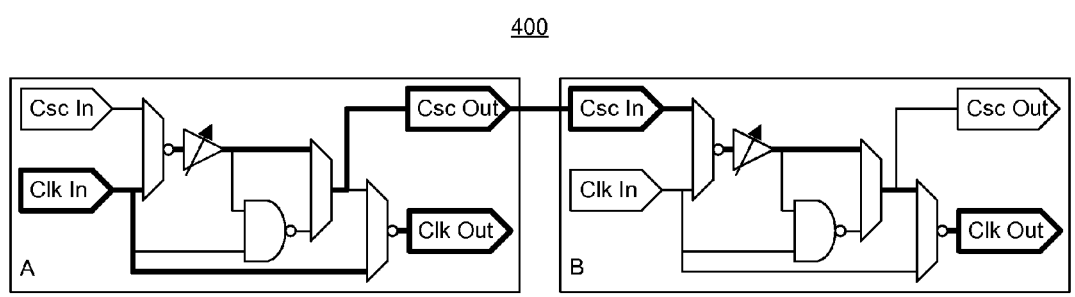
FIG. 4 is a circuit diagram illustrating another exemplary cascaded architecture using programmable delays.

FIG. 4 is a circuit diagram illustrating another exemplary cascaded architecture 400 using programmable delays. FIG. 4 illustrates an example in which a programmable delay B is not used and, therefore, is available for further processing a clock signal initially processed using programmable delay A.

For example, a clock signal is received at Clk In of programmable delay A, is delayed through the delay line, and output at Csc Out of programmable delay A. Further, the original clock signal received at Clk In of programmable delay A is output from Clk Out for use by one or more clock loads. As pictured, Csc Out of programmable delay A is coupled to Csc In of programmable delay B. Cascaded architecture 400 illustrates an example where the amount of delay that may be generated for the signal output from Clk Out of programmable delay B may be twice that of an individual programmable delay.

Figure 5:
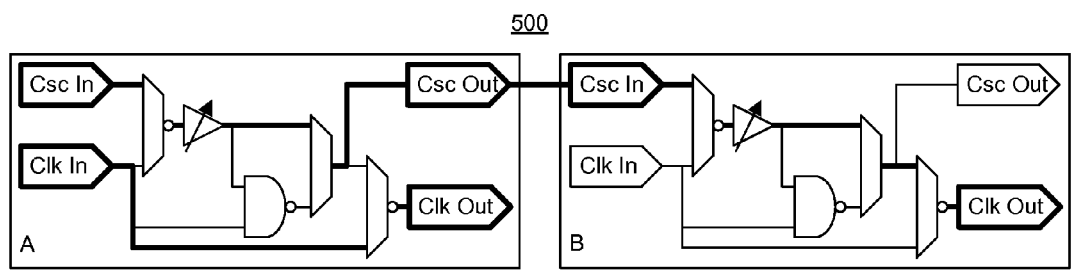
FIG. 5 is a circuit diagram illustrating another exemplary cascaded architecture using programmable delays.

FIG. 5 is a circuit diagram illustrating another exemplary cascaded architecture 500 using programmable delays. In cascaded architecture 500, a first clock signal received at Csc In of programmable delay A, processed through the delay line, and output from Csc Out of programmable delay A. As shown, Csc Out of programmable delay A is coupled to Csc In of programmable delay B and further delayed through the delay line of programmable delay B, before being output at Clk Out of programmable delay B. The first clock signal output through Clk Out of programmable delay B may have up to three times the total available delay provided by a single one of the programmable delays since the Csc In of programmable delay A is fed by a Csc Out of a previous programmable delay not shown.

Programmable delay A, however, further receives a second, independent clock signal at Clk In. The second clock signal is passed through programmable delay A without adding any additional delay and is output through Clk Out.

Figure 6:
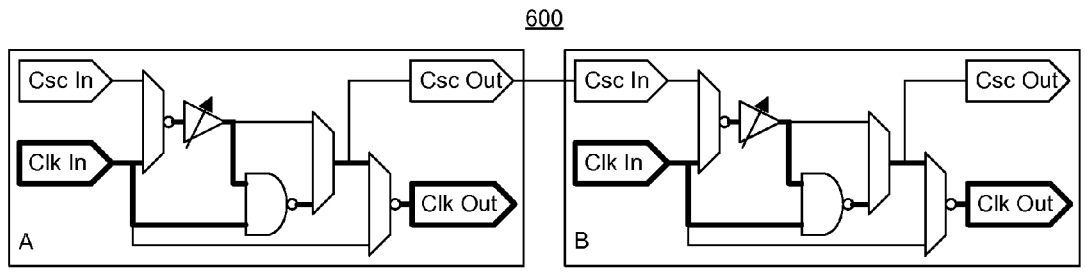
FIG. 6 is a circuit diagram illustrating another exemplary cascaded architecture using programmable delays.

FIG. 6 is a circuit diagram illustrating another exemplary cascaded architecture 600 using programmable delays. In cascaded architecture 600, two separate and independent clock signals are processed to generate two separate and independent pulse signals. Each of programmable delays A and B receives a clock signal at Clk In. The clock signal is delayed in the delay line of each of programmable delays A and B and then used to create a pulse signal by performing a NAND operation on the delayed clock signal and the original clock signal without delay. The resulting pulse signal is output from Clk Out of each of programmable delays A and B.

Figure 7:
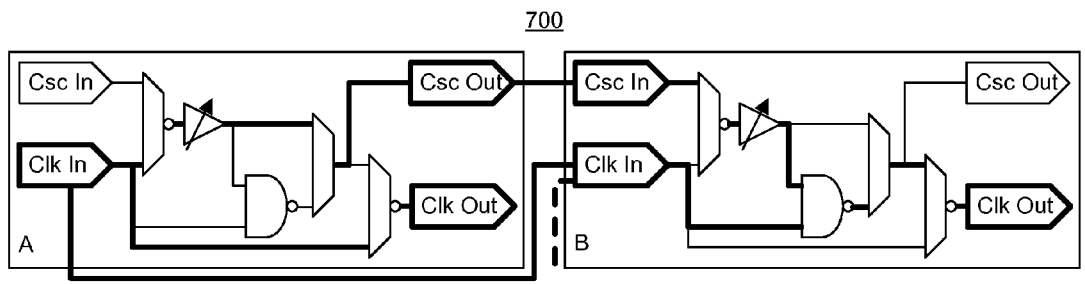
FIG. 7 is a circuit diagram illustrating another exemplary cascaded architecture using programmable delays.

FIG. 7 is a circuit diagram illustrating another exemplary cascaded architecture 700 using programmable delays. In the example of cascaded architecture 700, programmable delays A and B are cascaded to achieve a delay of twice that of a single one of the programmable delays. The delayed signal is then used to create a pulse signal in programmable delay B having twice the pulse width of a pulse signal generated using a single one of the programmable delays.

As pictured, a clock signal is received at Clk In of programmable delay A. The clock signal is delayed using the delay line in programmable delay A and output from Csc Out. The delayed clock signal is received at Csc In of programmable delay B, further delayed using the delay line of programmable delay B, and provided to the pulse generator therein.

The original clock signal received at Clk In of programmable delay A also is passed through to Clk Out of programmable delay A without any delay being added and is available for use by clock loads local to programmable delay A. As pictured, the original clock signal also may be passed to Clk In of programmable delay B using additional wire resources external to programmable delay A and used for generation of the pulse signal by the pulse generator in programmable delay B. Alternatively, a second and independent clock signal may be provided to the Clk In of programmable delay B illustrated in dashed line. The resulting pulse signal is output from Clk Out of programmable delay B.

Figure 8:
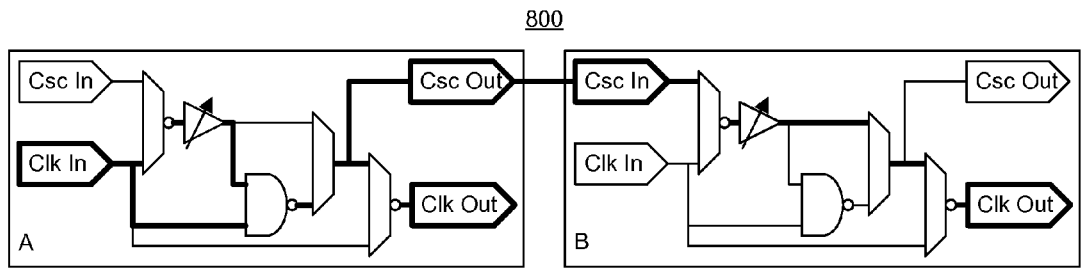
FIG. 8 is a circuit diagram illustrating another exemplary cascaded architecture using programmable delays.

FIG. 8 is a circuit diagram illustrating another exemplary cascaded architecture 800 using programmable delays. In the example of architecture 800, programmable delay A receives a clock signal at Clk In. The clock signal is delayed using the delay line of programmable delay A. The delayed clock signal is then provided to the pulse generator along with the original clock signal to generate a pulse signal using the pulse generator of programmable delay A. The pulse signal is output by both Csc Out and Clk Out of programmable delay A. The pulse signal from Clk Out may be used to drive clock loads in and around Clk Out of programmable delay A. The pulse signal from Csc Out is provided to Csc In of programmable delay B. The pulse signal is delayed using the delay line of programmable delay B and output through Clk Out of programmable delay B.

Figure 9:
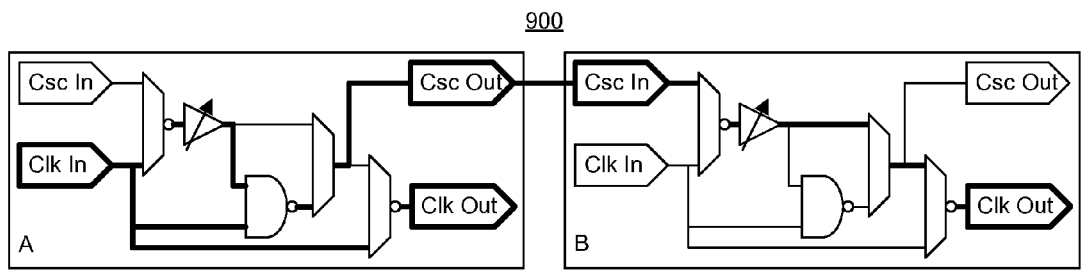
FIG. 9 is a circuit diagram illustrating another exemplary cascaded architecture using programmable delays.

FIG. 9 is a circuit diagram illustrating another exemplary cascaded architecture 900 using programmable delays. The example of cascaded architecture 900 is substantially similar to that of cascaded architecture 800. One exception is that programmable delay A does not output the pulse signal from both Csc Out and Clk Out. Rather, programmable delay A outputs the pulse signal from Csc Out, while outputting the original clock signal without any additional delay from Clk Out. The pulse signal output from Csc Out is provided to Csc In of programmable delay B, delayed through the delay line of programmable delay B, and output through Clk Out.

Figure 10:
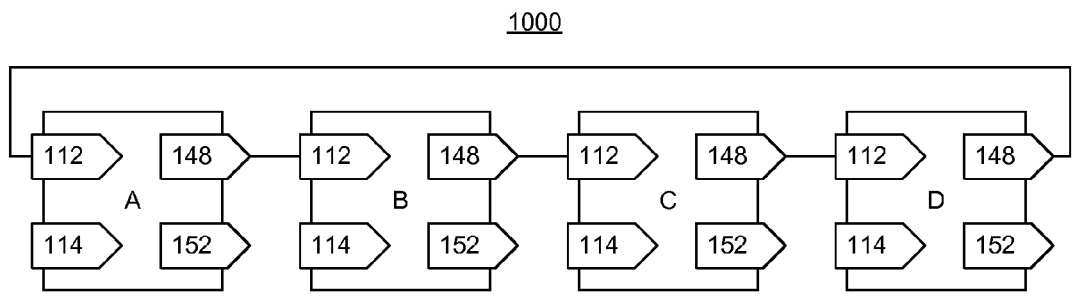
FIG. 10 is a block diagram illustrating another exemplary cascaded architecture using programmable delays.

FIG. 10 is a block diagram illustrating another exemplary cascaded architecture 1000 using programmable delays. Cascaded architecture 1000 includes 4 programmable delays A, B, C, and D cascaded together. As pictured, cascade output 148 of programmable delay A is coupled to cascade input 112 of programmable delay B. Cascade output 148 of programmable delay B is coupled to cascade input 112 of programmable delay C. Cascade output 148 of programmable delay C is coupled to cascade input 112 of programmable delay D. Finally, cascade output 148 of programmable delay D is coupled to cascade input 112 of programmable delay A.

Cascaded architecture 1000 allows a total delay of up to 4 times that of a single programmable delay to be applied to a received clock signal. Further, pulse signals having a pulse width of up to 4 times the pulse width of a pulse signal generated by a single programmable delay may be generated. In that case, programmable delay A is used as a signal entry point while the resulting output signal is output from clock output 152 of programmable delay D.

It should be appreciated, however, that an output signal may be taken from clock output 152 of any of programmable delays A, B, C, and/or D depending upon the amount of delay, the pulse width that is desired, and/or the location in the IC that the clock signal is needed. Similarly, the signal entry point may vary and be a clock input 114 of any of programmable delays A, B, C, and/or D. For example, using the loop back configuration illustrated in FIG. 10, a clock architecture may be created in which a signal enters programmable delay B through clock input 114, cascades through programmable delays C and D using cascade outputs 148, and is cascaded using the loop back connection to programmable delay A. The resulting signal may be output from clock output 152 of programmable delay A. While the examples described with reference to FIG. 10 utilize all four of the illustrated programmable delays, clock architectures of fewer than all of the illustrated delays may also be created. Within a given set of programmable delays arranged in a loop back configuration as shown within an IC, e.g., whether 2, 3, 4, or more programmable delays for the loop back configuration, the entry and exit points for the clock signal may be selected independently of one another.

Figure 11:
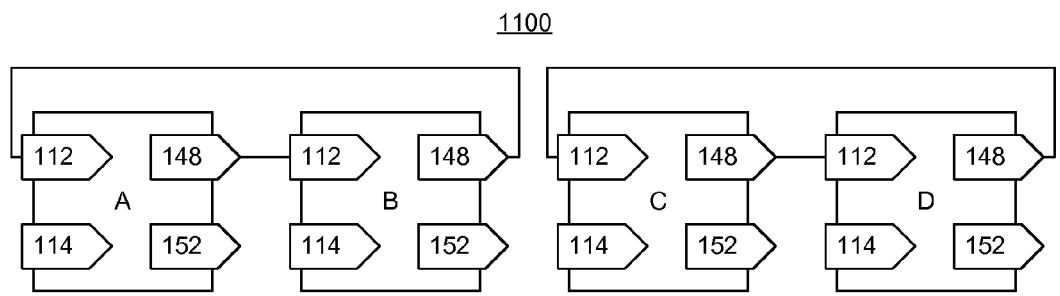
FIG. 11 is a block diagram illustrating another exemplary cascaded architecture using programmable delays.

FIG. 11 is a block diagram illustrating another exemplary cascaded architecture 1100 using programmable delays. Cascaded architecture 1100 includes four programmable delays A, B, C, and D. In the example of FIG. 11, programmable delays are cascaded together as two separate pairs.

In the first pair of programmable delays, cascade output 148 of programmable delay A is coupled to cascade input 112 of programmable delay B. Cascade output 148 of programmable delay B is coupled to cascade input 112 of programmable delay A.

In the second pair of programmable delays, cascade output 148 of programmable delay C is coupled to cascade input 112 of programmable delay D. Cascade output 148 of programmable delay D is coupled to cascade input 112 of programmable delay C.

Each pair of cascaded programmable delays may provide up to 2 times the delay of a single programmable delay and a pulse signal having a pulse width of up to 2 times that of a single programmable delay. One resulting output signal is output from clock output 152 of programmable delay B. Another resulting output signal is output from clock output 152 of programmable delay D.

In each of FIGS. 10 and 11, the connections between cascade output and a cascade input of the programmable delays may be fixed, i.e., created as a hardwired connection as part of the IC in which the programmable delays are implemented.

Figure 12:
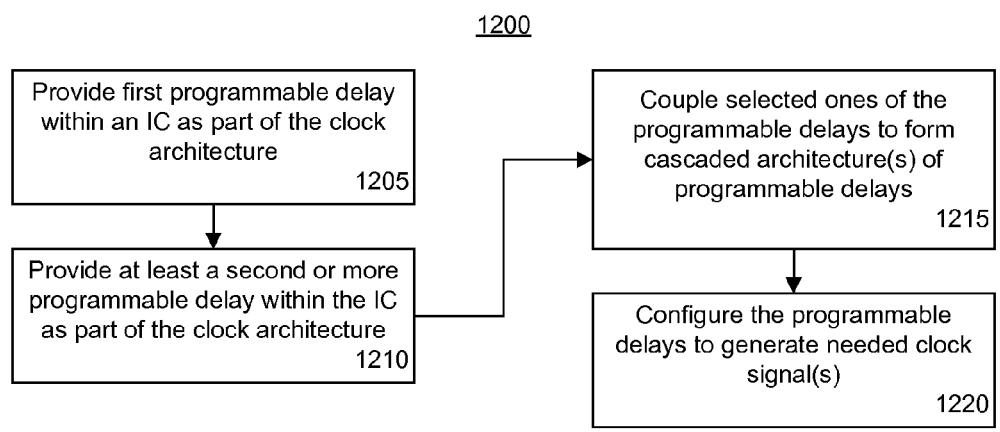
FIG. 12 is a flow chart illustrating a method of implementing a clock architecture within an integrated circuit (IC).

FIG. 12 is a flow chart illustrating a method 1200 of implementing a clock architecture within an IC. In block 1205, a first programmable delay is provided within an IC as part of the clock architecture, e.g., the clock tree, implemented therein. In block 1210, a second or more programmable delays are provided in the IC as part of the clock architecture. The programmable delays may be added throughout the clock architecture. In one aspect, a programmable delay is added at each leaf of the clock architecture. A leaf of a clock architecture, or clock tree, is a node where the clock signal leaves a routing track (wire) that delivers the clock signal from a clock source to a particular region or zone of the IC, at which point the clock signal switches to a distribution track (wire) for distribution to one or more clock loads local to the leaf node.

In block 1215, selected ones of the programmable delays are coupled together to form one or more cascaded architectures as illustrated within this specification. Two, or more, programmable delays are coupled by connecting a cascade output of one programmable delay with a cascade input of another programmable delay.

In block 1220, the programmable delays may be configured by loading appropriate values within the memory cells of the respective programmable delays for generating the clock signals needed or required by the circuit design that is being implemented.

In one aspect, the formation of cascade architectures may be performed using hardwired circuitry. For example, each programmable delay may be a hardwired, or fixed circuit block, that is configurable. The wiring between two, or more, cascaded programmable delays that connects a cascade output to a cascade input may be a hardwired, or fixed, connection within the IC.

Figure 13:
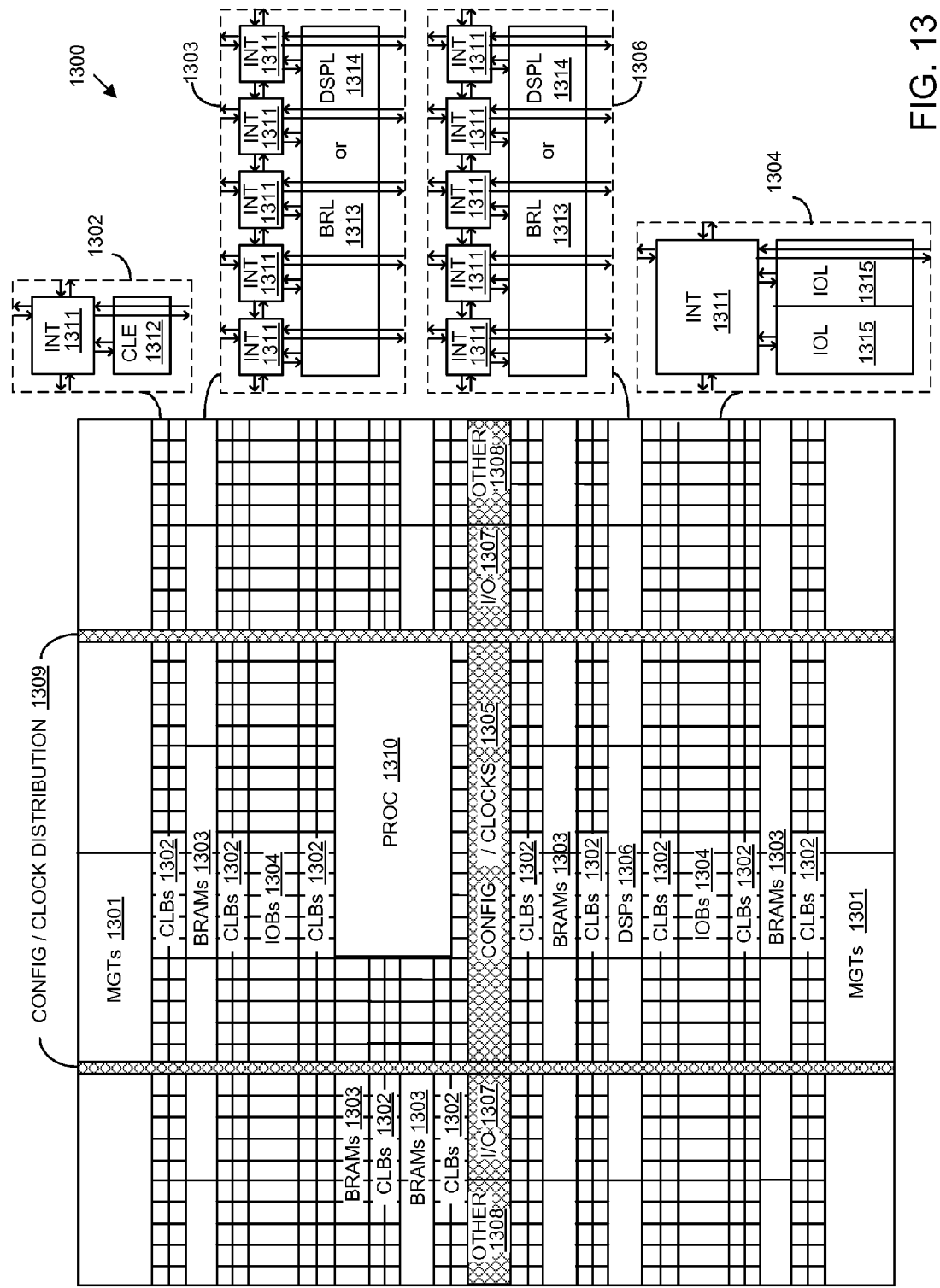
FIG. 13 is a block diagram illustrating an exemplary architecture for an IC.

FIG. 13 is a block diagram illustrating an exemplary architecture 1300 for an IC. In one aspect, architecture 1300 is implemented within a field programmable gate array (FPGA) type of IC. Architecture 1300 is also representative of an SOC type of IC. As noted, an SOC is an IC that includes a processor that executes program code and one or more other circuits and/or circuit systems. The circuits and/or circuit systems may operate cooperatively with one another and with the processor. In any case, the programmable delays described within this disclosure may be implemented throughout the clock areas illustrated in FIG. 13.

As shown, architecture 1300 includes several different types of programmable circuit, e.g., logic, blocks. For example, architecture 1300 may include a large number of different programmable tiles including multi-gigabit transceivers (MGTs) 1301, configurable logic blocks (CLBs) 1302, random access memory blocks (BRAMs) 1303, input/output blocks (IOBs) 1304, configuration and clocking logic (CONFIG/CLOCKS) 1305, digital signal processing blocks (DSPs) 1306, specialized I/O blocks 1307 (e.g., configuration ports and clock ports), and other programmable logic 1308 such as digital clock managers, analog-to-digital converters, system monitoring logic, and so forth.

In some ICs, each programmable tile includes a programmable interconnect element (INT) 1311 having standardized connections to and from a corresponding INT 1311 in each adjacent tile. Therefore, INTs 1311, taken together, implement the programmable interconnect structure for the illustrated IC. Each INT 1311 also includes the connections to and from the programmable logic element within the same tile, as shown by the examples included at the top of FIG. 13.

For example, a CLB 1302 can include a configurable logic element (CLE) 1312 that may be programmed to implement user logic plus a single INT 1311. A BRAM 1303 may include a BRAM logic element (BRL) 1313 in addition to one or more INTs 1311. Typically, the number of INTs 1311 included in a tile depends on the height of the tile. As pictured, a BRAM tile has the same height as five CLBs, but other numbers (e.g., four) may also be used. A DSP tile 1306 may include a DSP logic element (DSPL) 1314 in addition to an appropriate number of INTs 1311. An IOB 1304 may include, for example, two instances of an I/O logic element (IOL) 1315 in addition to one instance of an INT 1311. As will be clear to those of skill in the art, the actual I/O pads connected, for example, to IOL 1315 typically are not confined to the area of IOL 1315.

In the example pictured in FIG. 13, a columnar area near the center of the die, e.g., formed of regions 1305, 1307, and 1308, may be used for configuration, clock, and other control logic. Horizontal areas 1309 extending from this column are used to distribute the clocks and configuration signals across the breadth of the programmable IC. One or more programmable delays may be implemented on clock lines distributed throughout regions 1305, 1307, 1308, and/or 1309.

In one aspect, clock circuits, or leaf clock circuits, may be implemented in various locations within architecture 300. Such clock circuits may include a programmable delay as described within this disclosure. For example, a clock circuit including a programmable delay may be included, or located, at the intersection of region 1309 with one or more or each of columns including CLBs 1302, BRAMs 1303, and/or DSPs 1306. It should be appreciated, however, that the programmable delays may be included or located elsewhere within architecture 300 and that the examples provided herein are not intended to be limiting.

Some ICs utilizing the architecture illustrated in FIG. 13 include additional logic blocks that disrupt the regular columnar structure making up a large part of the IC. The additional logic blocks may be programmable blocks and/or dedicated circuitry. For example, a processor block depicted as PROC 1310 spans several columns of CLBs and BRAMs.

In one aspect, PROC 1310 is implemented as a dedicated circuitry, e.g., as a hard-wired processor, that is fabricated as part of the die that implements the programmable circuitry of the IC. PROC 1310 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1310 is omitted from architecture 1300 and replaced with one or more of the other varieties of the programmable blocks described. Further, such blocks may be utilized to form a "soft processor" in that the various blocks of programmable circuitry may be used to form a processor that executes program code as is the case with PROC 1310.

The phrase "programmable circuitry" means programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 13 that are external to PROC 1310 such as CLBs 1302 and BRAMs 1303 are considered programmable circuitry of the IC. Programmable circuitry may be configured or programmed to implement different physical circuits therein.

In general, the functionality of programmable circuitry is not established until configuration data is loaded into the IC. A set of configuration bits may be used to program programmable circuitry of an IC such as an FPGA. The configuration bit(s) are typically referred to as a "configuration bitstream." In general, programmable circuitry is not operational or functional without first loading a configuration bitstream into the IC. The configuration bitstream effectively implements or instantiates a particular physical circuit within the programmable circuitry. The configuration bitstream or circuit design specifies, for example, functional aspects of the programmable circuit blocks and physical connectivity among the various programmable circuit blocks that is otherwise non-existent. The configuration bitstream further specifies the values that may be loaded into the memory cells used to control operation of the programmable delays described herein.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry has dedicated circuit blocks and interconnects, for example, that are functional without first loading a configuration bitstream into the IC. An example of hardwired circuitry is PROC 1310.

In some instances, hardwired circuitry, e.g., the programmable delays, may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

FIG. 13 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 13 are purely exemplary. In an actual IC, for example, more than one adjacent column of CLBs may be included wherever the CLBs appear, to facilitate the efficient implementation of a user circuit design. The number of adjacent CLB columns, however, may vary with the overall size of the IC. Further, the size and/or positioning of blocks such as PROC 1310 within the IC are for purposes of illustration only and are not intended as a limitation.

In accordance with the inventive arrangements disclosed herein, a programmable delay circuit block and cascade architectures formed of two or more programmable delays are described. The inventive arrangements, when incorporated into a clock architecture of an IC, provide increased flexibility and control over clock signals and clock signal generation. Skew of clock signals may be controlled with increased accuracy. Further, pulse signals having a programmable pulse width may be generated thereby facilitating conversion of selected clocked circuit elements into latches to implement time borrowing operations when such selected, clocked elements are clocked using the pulse signal.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined within this disclosure, the terms "a" and "an" mean one or more than one. The term "plurality," as defined herein, means two or more than two. The term "another," as defined herein, means at least a second or more. The term "coupled," as defined herein, means connected, whether directly without any intervening elements or indirectly with one or more intervening elements, unless otherwise indicated. Two elements may also be coupled mechanically, electrically, or communicatively linked through a communication channel, pathway, network, or system.

As defined within this disclosure, the term "and/or" means any and all possible combinations of one or more of the associated listed items. The terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. Although the terms "first," "second," etc. may be used herein to describe various elements, these elements should not be limited by these terms, as these terms are only used to distinguish one element from another unless the context indicates otherwise.

As defined herein, the term "if" means "when," "upon," "in response to determining," "in response to detecting," "responsive to determining," or "responsive to detecting," depending on the context. Similarly, the phrase "if it is determined" or the phrase "if [a stated condition or event] is detected," as defined herein, means "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like may represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects further may be embedded in a computer program product, which includes all the features enabling the implementation of the methods and/or circuits described herein. The computer program product includes a computer-readable data storage medium. As defined herein, the phrase "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The corresponding structures, materials, acts, and equivalents of all means or step plus function elements in the claims below are intended to include any structure, material, or act for performing the function in combination with other claimed elements as specifically claimed.

A programmable delay circuit block includes an input stage having a cascade input and a clock input, wherein the input stage passes a signal received at the cascade input or a signal received at the clock input, a delay block configured to generate a delayed signal by applying a selected amount of delay to the signal passed from the input stage, and a pulse generator configured to generate a pulse signal having a pulse width that depends upon the amount of delay. The programmable delay circuit block also includes an output stage having a cascade output and a clock output. The output stage is configured to pass an inverted version of the pulse signal or the delayed signal from the cascade output and pass the signal received at the clock input, the inverted version of the pulse signal, or the delayed signal from the clock output.

The input stage may include a memory cell and may pass either the signal at the cascade input or the signal received at the clock input according to a value stored in the memory cell. Further, the input stage may selectively gate the signal received at the clock input according to a value stored in a memory cell.

The pulse generator may include a NAND circuit generating the pulse signal from an inverted version of the delayed signal and the signal received at the clock input.

The delay block may include a delay line having multiple taps and generating a plurality of candidate delayed signals. The delay block may also include a delay selector block passing one of the plurality of candidate delayed signals as the delayed signal. The delay line may be binary weighted.

The delay selector block may include a memory cell and an inverting multiplexer. The inverting multiplexer may select the delayed signal from the plurality of candidate delayed signals according to a value stored in the memory cell.

The output stage may include a plurality of memory cells, a multiplexer, and an inverting multiplexer. The multiplexer may pass the pulse signal or an inverted version of the delayed signal to the cascade output according to a value stored in a first of the plurality of memory cells. The inverting multiplexer may pass an inverted version of the signal received at the clock input, the pulse signal, or the inverted version of the delayed signal to the clock output according to the value stored in the first memory cell and a value stored in a second of the plurality of memory cells.

A clock circuit includes a first programmable delay circuit block having a first cascade input, a first clock input, a first delay line having multiple taps, a first pulse generator, a first cascade output, and a first clock output. The clock circuit also includes a second programmable delay circuit block having a second cascade input, a second clock input, a second delay line having multiple taps, a second pulse generator, a second cascade output, and a second clock output. The first cascade output is coupled to the second cascade input.

The first cascade output may pass an inverted version of a first pulse signal generated by the first pulse generator or a first delayed signal generated by the first delay line. The second cascade output may pass an inverted version of a second pulse signal generated by the second pulse generator or a second delayed signal generated by the second delay line. The first clock output may pass a signal received at the first clock input, the inverted version of the first pulse signal, or the first delayed signal. The second clock output may pass a second signal received at the second clock input, the inverted version of the second pulse signal, or the second delayed signal.

The first pulse generator may generate a first pulse signal having a pulse width that depends upon an amount of delay applied to a signal by the first delay line. The second pulse generator may generate a second pulse signal having a pulse width that depends upon an amount of delay applied to a signal by the second delay line.

In one aspect, the first programmable delay may delay a first clock signal and output the delayed first clock signal through the first cascade output. The second programmable delay may receive the delayed first clock signal through the second cascade input and further delay the delayed first clock signal. For example, the first programmable delay may output the first clock signal from the first clock output without applying a delay. In another example, the first clock signal may be received in the first programmable delay at the first cascade input. In that case, the first programmable delay may receive a second clock signal independent of the first clock signal at the first clock input and output the second clock signal from the first clock output without applying a delay.

In another aspect, the first programmable delay may delay a first clock signal and output the delayed first clock signal through the first cascade output. The second programmable delay may receive the delayed first clock signal at the second cascade input, further delay the delayed first clock signal, generate a pulse signal using the further delayed first clock signal, and output an inverted version of the pulse signal. In one example, the first programmable delay may further output the first clock signal through the first clock output without a delay. In still another example, the second programmable delay may receive a second clock signal independent of the first clock signal at the second clock input and use the second clock signal and the further delayed first clock signal within the pulse generator to generate the pulse signal.

In still another aspect, the first programmable delay may generate a pulse signal from a received clock signal and output an inverted version of the pulse signal through the first cascade output. The second programmable delay may receive the inverted version of the pulse signal at the second cascade input, delay the inverted version of the pulse signal, and output the delayed inverted version of the pulse signal. In that case, the first programmable delay may further output the inverted version of the pulse signal from the first clock output.

The first cascade output may be coupled to the second cascade input using fixed circuitry.

The features described within this disclosure may be embodied in other forms without departing from the spirit or essential attributes thereof. Accordingly, reference should be made to the following claims, rather than to the foregoing disclosure, as indicating the scope of such features and implementations.

What is claimed is:

1. A programmable delay circuit block, comprising:
   an input stage comprising a cascade input and a clock input;
   wherein the input stage passes a signal received at the cascade input or a signal received at the clock input;
   a delay block configured to generate a delayed signal by applying a selected amount of delay to the signal passed from the input stage;
   a pulse generator configured to generate a pulse signal having a pulse width that depends upon the amount of delay; and
   an output stage comprising a cascade output and a clock output;
   wherein the output stage is configured to pass an inverted version of the pulse signal or the delayed signal from the cascade output and pass the signal received at the clock input, the inverted version of the pulse signal, or the delayed signal from the clock output.

2. The programmable delay circuit block of claim 1, wherein the input stage comprises a memory cell and passes either the signal at the cascade input or the signal received at the clock input according to a value stored in the memory cell.

3. The programmable delay circuit block of claim 1, wherein the input stage selectively gates the signal received at the clock input according to a value stored in a memory cell.

4. The programmable delay circuit block of claim 1, wherein the pulse generator comprises a NAND circuit generating the pulse signal from an inverted version of the delayed signal and the signal received at the clock input.

5. The programmable delay circuit block of claim 1, wherein the delay block comprises:
   a delay line having multiple taps and generating a plurality of candidate delayed signals; and
   a delay selector block passing one of the plurality of candidate delayed signals as the delayed signal.

6. The programmable delay circuit block of claim 5, wherein the delay line is binary weighted.

7. The programmable delay circuit block of claim 5, wherein:
   the delay selector block comprises a memory cell and an inverting multiplexer; and
   the inverting multiplexer selects the delayed signal from the plurality of candidate delayed signals according to a value stored in the memory cell.

8. The programmable delay circuit block of claim 1, wherein:
   the output stage further comprises a plurality of memory cells, a multiplexer, and an inverting multiplexer;
   the multiplexer passes the pulse signal or an inverted version of the delayed signal to the cascade output according to a value stored in a first of the plurality of memory cells; and
   the inverting multiplexer passes an inverted version of the signal received at the clock input, the pulse signal, or the inverted version of the delayed signal to the clock output according to the value stored in the first memory cell and a value stored in a second of the plurality of memory cells.

9. A clock circuit, comprising:
   a first programmable delay circuit block comprising a first cascade input, a first clock input, a first delay line having multiple taps, a first pulse generator, a first cascade output, and a first clock output; and
   a second programmable delay circuit block comprising a second cascade input, a second clock input, a second delay line having multiple taps, a second pulse generator, a second cascade output, and a second clock output; and
   wherein the first cascade output is coupled to the second cascade input.

10. The clock circuit of claim 9, wherein:
    the first cascade output passes an inverted version of a first pulse signal generated by the first pulse generator or a first delayed signal generated by the first delay line;
    the second cascade output passes an inverted version of a second pulse signal generated by the second pulse generator or a second delayed signal generated by the second delay line;
    the first clock output passes a signal received at the first clock input, the inverted version of the first pulse signal, or the first delayed signal; and
    the second clock output passes a second signal received at the second clock input, the inverted version of the second pulse signal, or the second delayed signal.

11. The clock circuit of claim 9, wherein:
    the first pulse generator generates a first pulse signal having a pulse width that depends upon an amount of delay applied to a signal by the first delay line; and
    the second pulse generator generates a second pulse signal having a pulse width that depends upon an amount of delay applied to a signal by the second delay line.

12. The clock circuit of claim 9, wherein:
    the first programmable delay delays a first clock signal and outputs the delayed first clock signal through the first cascade output; and
    the second programmable delay receives the delayed first clock signal through the second cascade input and further delays the delayed first clock signal.

13. The clock circuit of claim 12, wherein the first programmable delay further outputs the first clock signal from the first clock output without applying a delay.

14. The clock circuit of claim 12, wherein:
    the first clock signal is received in the first programmable delay at the first cascade input;
    the first programmable delay receives a second clock signal independent of the first clock signal at the first clock input and outputs the second clock signal from the first clock output without applying a delay.

15. The clock circuit of claim 9, wherein:
the first programmable delay delays a first clock signal and outputs the delayed first clock signal through the first cascade output; and
the second programmable delay receives the delayed first clock signal at the second cascade input, further delays the delayed first clock signal, generates a pulse signal using the further delayed first clock signal, and outputs an inverted version of the pulse signal.

16. The clock circuit of claim 15, wherein the first programmable delay further outputs the first clock signal through the first clock output without a delay.

17. The clock circuit of claim 15, wherein the second programmable delay receives a second clock signal independent of the first clock signal at the second clock input and uses the second clock signal and the further delayed first clock signal within the pulse generator to generate the pulse signal.

18. The clock circuit of claim 9, wherein:
the first programmable delay generates a pulse signal from a received clock signal and outputs an inverted version of the pulse signal through the first cascade output; and
the second programmable delay receives the inverted version of the pulse signal at the second cascade input, delays the inverted version of the pulse signal, and outputs the delayed inverted version of the pulse signal.

19. The clock circuit of claim 18, wherein the first programmable delay further outputs the inverted version of the pulse signal from the first clock output.

20. The clock circuit of claim 9, wherein the first cascade output is coupled to the second cascade input using fixed circuitry.

* * * * *